(12) United States Patent
Wu et al.

(10) Patent No.: US 7,521,770 B2
(45) Date of Patent: Apr. 21, 2009

(54) IMAGE CAPTURING DEVICE

(75) Inventors: Ying-Cheng Wu, Taipei Hsien (TW); Kun-Hsiao Liu, Taipei Hsien (TW)

(73) Assignee: Hon Hai Precision Industry Co., Ltd., Tu-Cheng, Taipei Hsien (TW)

( * ) Notice: Subject to any disclaimer, the term of this patent is extended or adjusted under 35 U.S.C. 154(b) by 19 days.

(21) Appl. No.: 11/862,510

(22) Filed: Sep. 27, 2007

(65) Prior Publication Data

US 2008/0265350 A1   Oct. 30, 2008

(30) Foreign Application Priority Data

Apr. 29, 2007   (CN) .................. 2007 1 0200563

(51) Int. Cl.
*H01L 29/06* (2006.01)
*H01L 27/00* (2006.01)
*H04N 5/225* (2006.01)
*H01J 5/02* (2006.01)

(52) U.S. Cl. .................. 257/432; 257/433; 257/379; 257/516; 257/E27.114; 257/E31.127

(58) Field of Classification Search .................. 257/433, 257/432, E31.127, 379, 516, 924, E27.114; 348/360, E5.024; 250/208, 239

See application file for complete search history.

(56) References Cited

U.S. PATENT DOCUMENTS

| 6,014,586 | A | 1/2000 | Weinberg et al. |
| 6,518,656 | B1* | 2/2003 | Nakayama et al. .......... 257/680 |
| 7,342,215 | B2* | 3/2008 | Webster et al. ........... 250/208.1 |
| 7,408,205 | B2* | 8/2008 | Webster et al. ................. 257/99 |
| 2004/0041088 | A1* | 3/2004 | Chen .......................... 250/239 |

* cited by examiner

Primary Examiner—Long K Tran

(57) ABSTRACT

An image capturing device includes an image sensor package and a lens module aligned with the image sensor package. The image sensor package includes a substrate, at least one passive component, an insulative layer, and an image sensor. The substrate has a surface facing an object side of the image capturing device, the surface defines a cavity therein. The at least one passive component is disposed within the cavity and electrically connected to the substrate. The insulative layer is received in the cavity and encases the at least one passive component. The image sensor is disposed on the insulative layer and electrically connected to the substrate. The holder has an end connecting with the barrel and an opposite end secured on the substrate.

20 Claims, 2 Drawing Sheets

IMAGE CAPTURING DEVICE

CROSS-REFERENCE TO RELATED APPLICATIONS

This application is related to a co-pending U.S. patent application Ser. No. 11/850,619, entitled "SEMICONDUCTOR PACKAGE", by Ying-Cheng Wu et al. Such application has the same assignee as the present application and has been concurrently filed herewith. The disclosure of the above-identified application is incorporated herein by reference.

TECHNICAL FIELD

The present invention relates to transducers and, particularly, relates to a miniaturized image capturing device with a miniaturized image sensor package.

DESCRIPTION OF RELATED ART

Referring to FIG. 2, an image sensor package 1 of an image capturing device typically includes a chip 2, a number of passive components 3, and a substrate 4. The chip 2 and the passive components 3 are disposed on the substrate 4, and are electrically coupled to the substrate 4. Normally, the chip 2 is placed on a central portion of a surface 5 of the substrate 4, and the passive components 3 are placed on the surface 5 around the chip 2. Obviously, the image sensor package 1 thus packaged tends to be bulky, since the substrate 4 should be formed with the surface 5 large enough to receive both the chip 2 and the passive components 3. The image capturing device having the image sensor package 1 tends to be bulky too, and does not accord with miniaturization of the image capturing device.

What is needed, therefore, is a miniaturized image capturing device with a miniaturized image sensor package.

SUMMARY

In accordance with one present embodiment, an image capturing device includes an image sensor package and a lens module aligned with the image sensor package. The image sensor package includes a substrate, at least one passive component, an insulative layer, and an image sensor. The substrate has a surface facing an object side of the image capturing device. A cavity is defined in the surface. The at least one passive component is disposed within the cavity and electrically connected to the substrate. The insulative layer is received in the cavity and encases the at least one passive component. The image sensor is disposed on the insulative layer and electrically connected to the substrate. The lens module includes a barrel and a holder. The barrel receives at least one lens therein. The holder has an end connecting with the barrel and an opposite end secured on the substrate.

BRIEF DESCRIPTION OF THE DRAWING

Many aspects of the present image capturing device should be better understood with reference to the following drawings. The components in the drawings are not necessarily drawn to scale, the emphasis instead being placed upon clearly illustrating the principles of the present image capturing device. Moreover, in the drawings, like reference numerals designate corresponding parts throughout the several views.

DETAILED DESCRIPTION OF THE EMBODIMENTS

Figure 1:
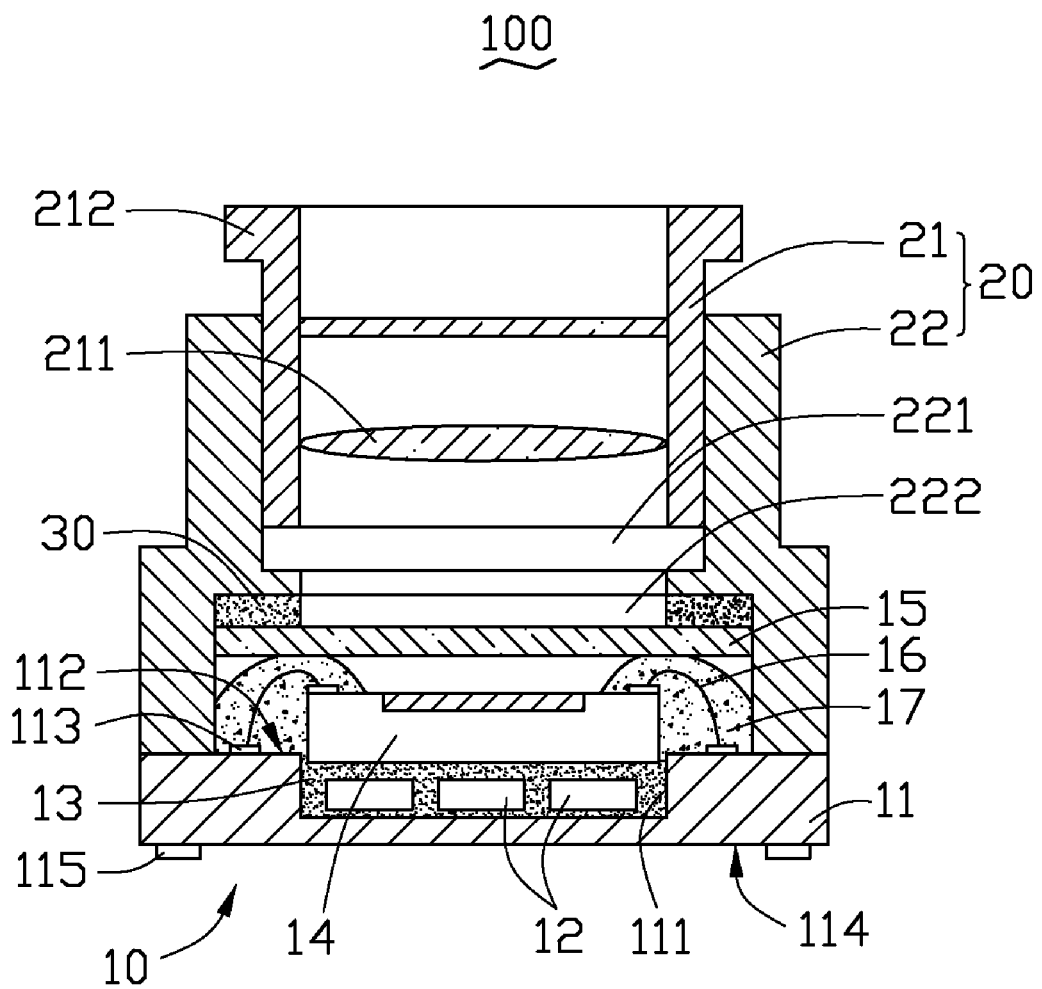
FIG. 1 is schematic, cross-sectional view of an image capturing device, according to an embodiment of the present invention.
Figure 2:
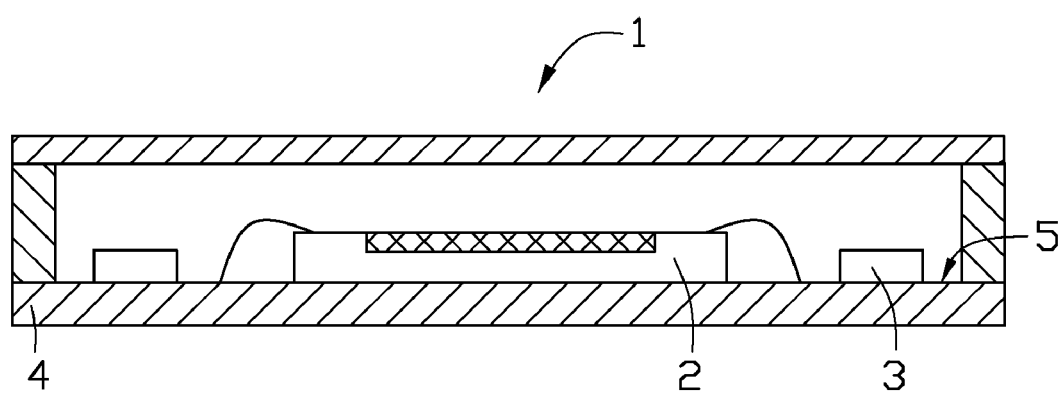
FIG. 2 is schematic, cross-sectional view of an image sensor package, according to related art.

Embodiments of the present image capturing device will be described below in detail with reference to the drawing.

Referring to FIG. 1, an image capturing device 100, according to an embodiment, includes an image sensor package 10 and a lens module 20. The image sensor package 10 is aligned with the lens module 20.

The image sensor package 10 includes a substrate 11, at least one passive component 12, an insulative layer 13, an image sensor 14, and a cover 15. The substrate 11 defines a cavity 111 therein. The at least one passive component 12 is placed within the cavity 111, and is electrically connected to the substrate 11. The insulative layer 13 is received in the cavity 111 and encases the at least one passive component 12. The image sensor 14 is disposed on the insulative layer 13, and is electrically connected to the substrate 11. The cover 15 is disposed above the substrate 11 for sealing the image sensor 14 between the cover 15 and the substrate 11.

The substrate 11 could be, typically, a circuit-bearing substrate including a packaging surface 112 (i.e., upper surface) facing the lens module 20; the cavity 111 is sunken from the packaging surface 112. Additionally, the substrate 11 further includes a number of first welding pads 113 formed on the packaging surface 112. The first welding pads 113 are configured for electrically coupling the image sensor 14 and the substrate 11. Specifically, the substrate 11 further includes a number of second welding pads 115 formed on a bottom surface 114 (i.e., surface opposite the packaging surface 112) of the substrate 11. The second welding pads 115 are configured for coupling the image sensor package 10 to an outside circuit (not shown). The second welding pads 115 can be patterned in form of: e.g., BGA (ball gird array), LCC (leadless chip carrier) or leadframe.

The substrate 11 can be made from material such as plastic, ceramic, or glass. In this illustrated embodiment, the substrate 11 is, advantageously, made from plastic comprised of epoxy resin doped with organic silicon. Also, other alternative types of plastic, like, plastic comprised of epoxy resin doped with glass fiber or plastic comprised of epoxy doped with aramid fibers may be considered.

The cavity 111 is, beneficially, defined on a central portion of the packaging surface 112. Preferably, a width and a length of the cavity 111 are respectively larger than that of the image sensor 14; the depth of the cavity 111 is greater than a height of the passive component 12. Thus, the image sensor 14 can be partially/totally received in the cavity 111 to reduce a height of the image sensor package 10. In this illustrated embodiment, the image sensor 14 is partially received in the cavity 111.

The at least one passive component 12 may be at least one surface mount device (SMD), and can be mounted in the cavity 111 using surface mount technology (SMT). The at least one passive component 12 can be a resistor or a capacitor. In this embodiment, the at least one passive component 12 includes a number of capacitors (e.g., decoupling capacitor) for reducing electrical noise generated between a power source and ground.

The insulative layer 13 could be made from curable adhesive such as UV curable adhesive. The image sensor 14 is directly attached to the insulative layer 13. Specifically, the insulative layer 13 is, advantageously, formed by the steps of: (1) filling the cavity with the curable adhesive in a liquid state until the curable adhesive covers the at least one passive component 12; (2) curing the curable adhesive to a solid-liquid state; (3) placing the image sensor 14 on the curable adhesive; (4) final curing of the curable adhesive. Thus, the insulative layer 13 is formed with an embedding function for the at least one passive component and a supporting function for the image sensor 14.

The image sensor 14 is coupled to the first welding pads 113 using a number of wires 16. The wires 16 are, advantageously, made of an excellent conductor, such as, for example, gold, silver, or copper. In the present embodiment, the first welding pads 113 and the wires 16 are embedded in a curable adhesive 17.

In the present embodiment, the cover 15 is disposed on the top of the curable adhesive 17. The cover 15 is a transparent cover, which can allow light to strike the image sensor 14. The material of the cover 15 can be selected from glass or plastic. The cover 15 is disposed on an adhesive which is attached around the image sensor 14, wherein the cover 15 cooperates with the adhesive to seal a sensitive area of the image sensor 14.

The image sensor package 10 packaging the at least one passive component 12 within the cavity 111 under the image sensor 14 can save space, thus size of the image sensor package 10 is reduced. It is understood that the image sensor can also be other type of semiconductor chips.

The lens module 20 includes a barrel 21 with at least one lens 211 received therein and a holder 22. The material of the barrel 21 can, usefully, be selected from the group consisting of polycarbonate, acrylonitrile-butadiene-styrene, and any combinations thereof. The barrel 21 can, beneficially, also have a focus-adjusting ring 212 arranged at an end of the barrel away from the image sensor package 10, in order to allow the focus of the image capturing device 100 to be conveniently adjusted. Advantageously, the focus-adjusting ring 212 is integrally formed with the barrel 21. Moreover, in order to improve light transmittance in the lens 211, the lens 211 can further have anti-reflection coatings on its two surfaces facing along the direction of the optical axis of the lens 211.

The holder 22 defines a first receiving portion 221 and a second receiving portion 222 communicating with the first receiving portion 221. The first receiving portion 221 is substantially cylindrical and is both shaped and sized (i.e., is, thus, properly structured/configured) for fittingly receiving the barrel 21. The second receiving portion 222 has an approximately rectangular parallelepiped shape. In the present embodiment, an end of the holder 22 away from the barrel 21 is secured on the substrate 11 of the image sensor package 10, so that, partial portions of the image sensor 14, the curable adhesive 17, and the cover 15 are received in the second receiving portion 222. In the present embodiment, the cover 15 can be secured to the holder 22 by an adhesive 30. Securing an end of the holder 22 on the substrate 11 can make the image capturing device 100 more compact.

It will be understood that the above particular embodiments and methods are shown and described by way of illustration only. The principles and the features of the present invention may be employed in various and numerous embodiment thereof without departing from the scope of the invention as claimed. The above-described embodiments illustrate the scope of the invention but do not restrict the scope of the invention.

What is claimed is:

1. An image capturing device comprising:
   an image sensor package, the image sensor package comprising:
   a substrate including a surface facing an object side of the image capturing device, and a cavity sunken from the surface in a direction away from the object side of the image capturing device;
   at least one passive component disposed within the cavity and electrically connected to the substrate;
   an insulative layer received in the cavity, the insulative layer encasing the at least one passive component; and
   an image sensor disposed on the insulative layer and electrically connected to the substrate,
   a lens module attached to the image sensor package, the lens module comprising:
   a barrel with at least one lens received therein, the at least one lens aligned with the image sensor; and
   a holder with an end connecting with the barrel and an opposite end secured on the substrate.

2. The image capturing device as claimed in the claim 1, wherein a width and a length of the cavity are respectively larger than that of the image sensor; the depth of the cavity being greater than a height of the passive component.

3. The image capturing device as claimed in the claim 2, wherein the image sensor is partially received in the cavity.

4. The image capturing device as claimed in the claim 2, wherein the image sensor is totally received within the cavity.

5. The image capturing device as claimed in the claim 1, wherein the substrate further includes a plurality of welding pads formed on the surface of the substrate facing the object side of the image capturing device, the first welding pads being configured for electrically coupling the image sensor to the substrate.

6. The image capturing device as claimed in the claim 5, wherein the image sensor is coupled to the first welding pads using a plurality of wires, the first welding pads and the wires are embedded in a curable adhesive.

7. The image capturing device as claimed in the claim 6, wherein the image sensor package further comprises a cover disposed over the curable adhesive.

8. The image capturing device as claimed in the claim 1, wherein the substrate further includes a plurality of welding pads formed on another surface of the substrate away from the object side of the image capturing device, the welding pads being configured for coupling the image sensor package to an outside circuit.

9. The image capturing device as claimed in the claim 8, wherein the welding pads are patterned in a form selected from a group consisting of BGA, LCC or leadframe.

10. The image capturing device as claimed in the claim 1, wherein the material of the substrate is selected from a group consisting of plastic, ceramic or glass.

11. The image capturing device as claimed in the claim 1, wherein the substrate can be made from a compound selected from a group consisting of epoxy resin doped with organic silicon, epoxy resin doped with glass fiber, and epoxy resin doped with aramid fibers.

12. The image capturing device as claimed in the claim 1, wherein the insulative layer is made from curable adhesive, the image sensor being directly attached on the insulative layer.

13. The image capturing device as claimed in the claim 1, wherein the material of the barrel is selected from the group consisting of polycarbonate, acrylonitrile-butadiene-styrene, and any combinations thereof.

14. The image capturing device as claimed in the claim 1, wherein the barrel has a focus-adjusting ring arranged at an end of the barrel away from the image sensor package.

15. The image capturing device as claimed in the claim 14, wherein the focus-adjusting ring is integrally formed with the barrel.

16. The image capturing device as claimed in the claim 1, wherein anti-reflection coatings are coated on opposite two surfaces facing along the direction of the optical axis of the lens, of the lens.

17. An image capturing device comprising:
   a substrate comprising a surface facing an object side of the image capturing device, and a cavity sunken from the surface in a direction away from the object side of the image capturing device;
   an insulative layer received in the cavity;
   at least one passive component embedded in the insulative layer in the cavity and electrically connected to the substrate;
   an image sensor attached to the insulative layer and electrically connected to the substrate;
   a holder secured to the substrate; and
   a barrel with at least one lens received therein attached to the holder;
   wherein the image sensor is aligned with the at least one lens and at least partly overlapped with the at least one passive component in a direction parallel to an optical axis of the at least one lens.

18. The image capturing device as claimed in the claim 17, further comprising a transparent cover disposed on an adhesive which is attached around the image sensor, wherein the cover cooperates with the adhesive to seal a sensitive area of the image sensor.

19. The image capturing device as claimed in the claim 18, wherein a plurality of welding pads is formed on the surface of the substrate facing the object side of the image capturing device, the welding pads electrically coupled to the substrate are electrically coupled to the image sensor via wires, the welding pads and the wires embedded in the curable adhesive.

20. The image capturing device as claimed in the claim 18, wherein the cover is adhered to the holder another adhesive.

* * * * *